United States Patent

Holland

[11] Patent Number: 6,104,612
[45] Date of Patent: *Aug. 15, 2000

[54] CLIP-ON HEAT SINK

[75] Inventor: Kenneth John Holland, Wakefield, Mass.

[73] Assignee: Schneider Automation Inc., North Andover, Mass.

[*] Notice: This patent issued on a continued prosecution application filed under 37 CFR 1.53(d), and is subject to the twenty year patent term provisions of 35 U.S.C. 154(a)(2).

[21] Appl. No.: 09/036,890

[22] Filed: Mar. 9, 1998

[51] Int. Cl.⁷ ........................................................ H05K 7/20
[52] U.S. Cl. ........................... 361/704; 24/455; 165/80.3; 174/16.3; 257/719; 361/722
[58] Field of Search ................................ 24/455, 458, 625, 24/563, 295; 174/16.3; 257/706, 707, 719, 727; 165/80.3, 185; 267/150, 158, 160; 248/316.7, 505, 510; 361/704–707, 709, 710, 717–719, 722

[56] References Cited

U.S. PATENT DOCUMENTS

| | | |
|---|---|---|
| D. 262,961 | 2/1982 | McCarthy . |
| D. 283,418 | 4/1986 | McCarthy . |
| D. 295,281 | 4/1988 | Moore . |
| D. 295,282 | 4/1988 | Moore . |
| D. 307,540 | 5/1990 | McCarthy . |
| D. 313,399 | 1/1991 | Earl et al. . |
| D. 314,945 | 2/1991 | McCarthy . |
| D. 317,907 | 7/1991 | McCarthy . |
| D. 322,594 | 12/1991 | McCarthy . |
| 4,012,769 | 3/1977 | Edwards et al. ........................... 165/80 |
| 4,054,901 | 10/1977 | Edwards . |
| 4,215,361 | 7/1980 | McCarthy . |
| 4,609,040 | 9/1986 | Moore . |
| 4,674,005 | 6/1987 | Laoz . |
| 4,710,852 | 12/1987 | Keen . |
| 4,803,545 | 2/1989 | Birkle . |
| 4,872,089 | 10/1989 | Ocken et al. . |
| 4,899,255 | 2/1990 | Case et al. . |
| 5,470,795 | 11/1995 | Shushurin . |
| 5,576,933 | 11/1996 | Campanella et al. . |
| 5,611,393 | 3/1997 | Vasconcelos et al. . |
| 5,844,312 | 12/1998 | Hinshaw . |

FOREIGN PATENT DOCUMENTS 05047969   2/1993   Japan .

OTHER PUBLICATIONS

"Kühlkörper für Halbleiterbauelement im Plastikgehäuse," Feinwerk Technik, vol. 75, No. 7, 1971 p. 334 XP–002104611 DE., 1 page.

*Primary Examiner*—Gerald Tolin
*Attorney, Agent, or Firm*—Michael J. Femal; Larry I. Golden

[57] ABSTRACT

The heat sink (10) of the present invention is used to absorb and dissipate heat from a solid-state device. The heat sink (10) comprises a generally U-shaped body (18) of a thermally conductive material. The U-shaped body (18) comprises two continuous legs (20, 22) having widths greater than the width of the solid-state device.

23 Claims, 2 Drawing Sheets

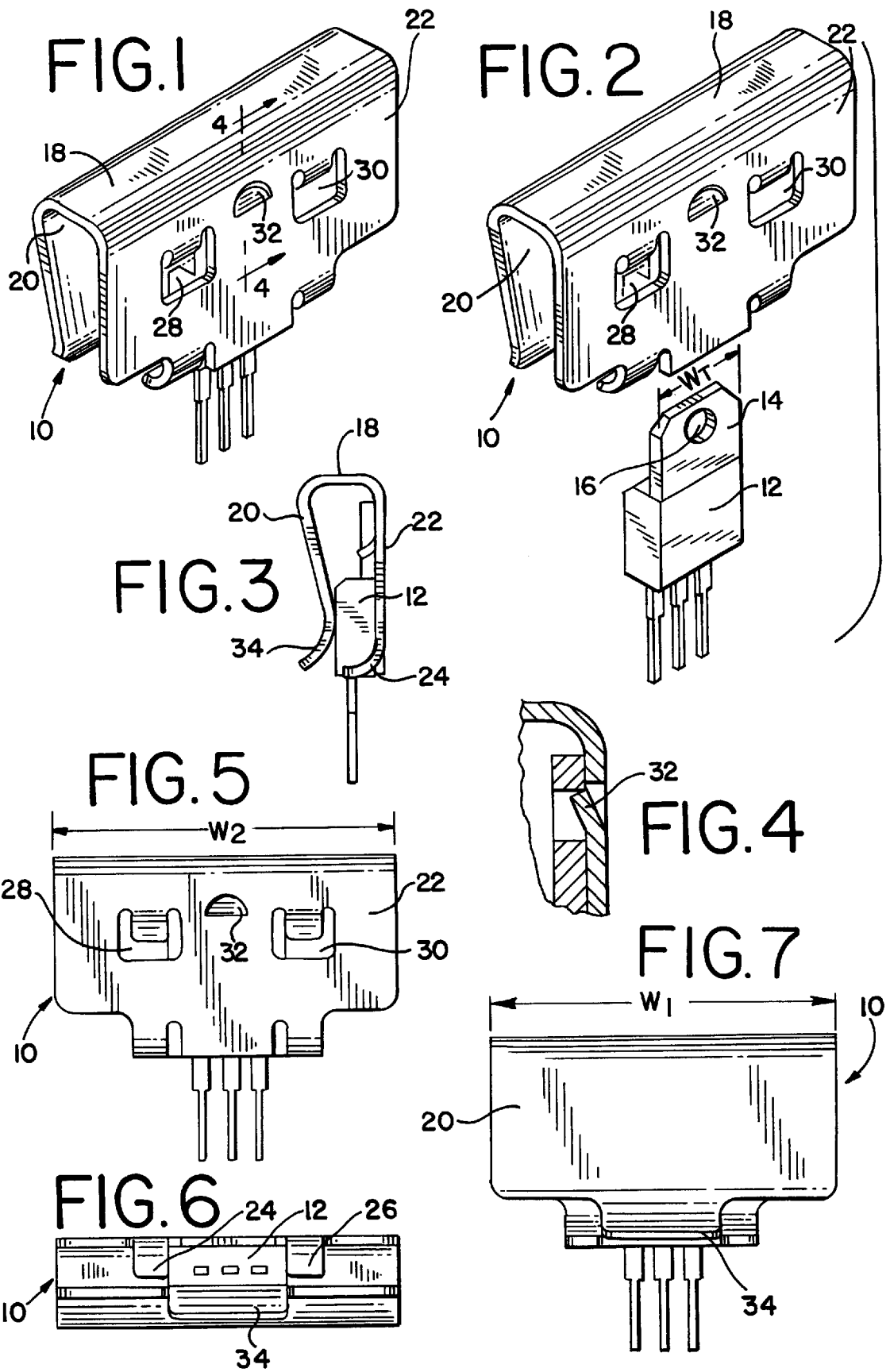

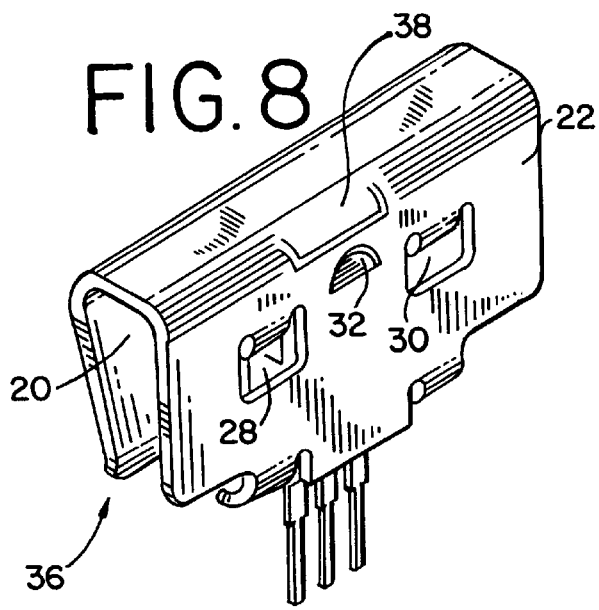
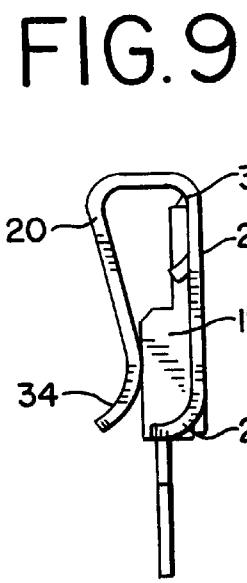
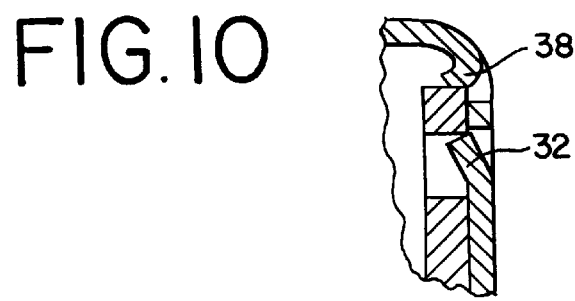
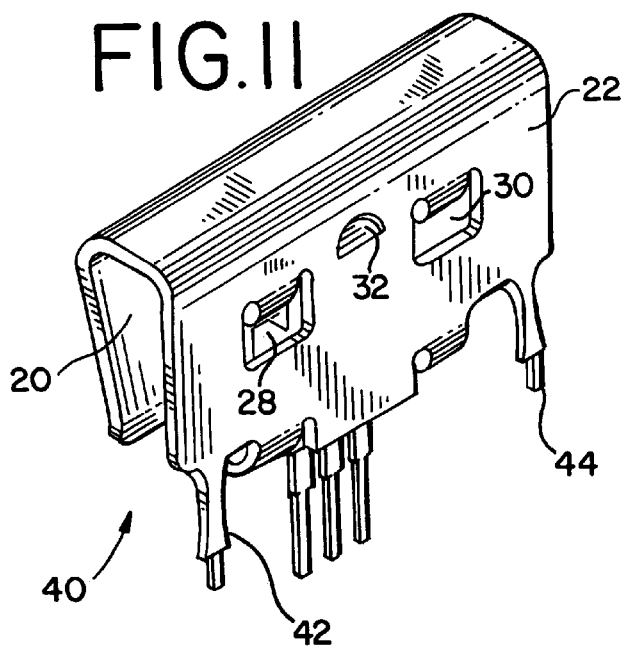
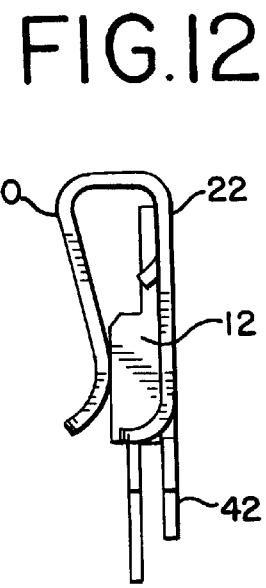

CLIP-ON HEAT SINK

DESCRIPTION

1. Technical Field

The present invention relates to a heat sink for withdrawing and dissipating heat from a solid-state device. More particularly, the present invention relates to the use of a clip-on heat sink with enhanced surface area to increase the amount of heat that can be removed from a solid-state device via natural convection cooling. The design of the heat sink allows for tighter spacing of solid-state devices.

2. Background of the Invention

The power dissipated by a solid-state device heats the semiconductor junction of the device. Because semiconductor junctions are very sensitive to heat, if the solid-state device cannot dissipate heat quickly, the semiconductor junction may be destroyed. Thus, solid-state devices often require heat sinks. A heat sink is a piece of metal designed to absorb excess heat generated by the solid-state device, and dissipate the heat into the air.

The surface area of the heat sink is proportional to the amount of heat absorbed from the solid-state device. Thus, to dissipate sufficient heat from the solid-state device, conventional heat sinks tend to be large and bulky. As a result, it is not possible to tightly space solid-state devices using conventional heat sink devices without disrupting natural convection airflow.

Solid-state devices are conventionally attached to a metal tab having a hole. The hole is utilized to mount the heat sink on the solid-state device with a threaded fastener. The insertion of the threaded fastener typically requires manual operation, thus slowing the production rate of the solid-state devices with the heat sink considerably, and adding to the expense of the process.

SUMMARY OF THE INVENTION

The heat sink of the present invention is used to absorb and dissipate heat from a solid-state device. The heat sink comprises a generally U-shaped body of a thermally conductive material. The U-shaped body comprises two continuous legs having widths greater than the width of the solid-state device. The heat sink of the present invention has a large surface area to increase the amount of heat removed from the solid-state device by natural convection. The design of the heat sink allows tighter spacing of solid-state devices than is possible with conventional heat sinks, without disrupting natural convection airflow. Thus, the heat sink may be used in densely packaged industrial control electronics at elevated ambient temperatures. In addition, the clip-on design of the heat sink eliminates the cost and assembly labor of additional heat sink mounting hardware.

BRIEF DESCRIPTION OF THE DRAWINGS

FIG. 1 is a perspective view of a heat sink engaged with a transistor in accordance with the present invention;

FIG. 2 is a perspective view of the heat sink, the transistor and a tab attached to the transistor in accordance with the present invention;

FIG. 3 is a side view of the heat sink engaged with the transistor of FIG. 1;

FIG. 4 is an exploded view of the hole in the tab engaged with the clasp of the heat sink of FIG. 1;

FIG. 5 is a back view of the heat sink engaged with the transistor of FIG. 1;

FIG. 6 is a bottom view of the heat sink engaged with the transistor of FIG. 1;

FIG. 7 is a front view of the heat sink engaged with the transistor of FIG. 1;

FIG. 8 is a perspective view of an alternate embodiment of a heat sink engaged with a transistor in accordance with the present invention;

FIG. 9 is a side view of the heat sink engaged with the transistor of FIG. 8;

FIG. 10 is an exploded view of the hole in the tab engaged with the clasp of the heat sink of FIG. 8;

FIG. 11 is a perspective view of an alternate embodiment of a heat sink engaged with a transistor in accordance with the present invention; and FIG. 12 is a side view of the heat sink engaged with the transistor of FIG. 11.

DETAILED DESCRIPTION OF THE PREFERRED EMBODIMENT

While this invention is susceptible of embodiments in many different forms, there will herein be described in detail a preferred embodiment of the invention with the understanding that the present disclosure is to be considered as an exemplification of the principles of the invention and is not intended to limit the broad aspects of the invention of the embodiment illustrated.

A clip-on heat sink 10 of the present invention dissipates heat from a solid-state device, shown as transistor 12. Transistor 12 is attached to a metal tab 14 having a hole 16. Heat sink 10 is formed using a resilient material. In the preferred embodiment of the present invention, the resilient material is a copper alloy. More specifically, the resilient material is a beryllium copper alloy. Specifically, alloy no. 174 is used as the resilient material; however, any spring-tempered metal, such as any copper, aluminum or any other conventional heat sink materials, may also be used.

The heat sink 10 comprises a generally U-shaped body 18 of a thermally conductive material. The U-shaped body 18 comprises a first continuous leg 20 and a second continuous leg 22. The width $w_1$ (FIG. 7) of the first continuous leg 20 is greater than the width $W_T$ (FIG. 2) of the transistor 12, and the width $w_2$ (FIG. 5) of the second continuous leg 22 is substantially the same as the width $w_1$ of the first leg 20. A pair of inwardly-oriented tabs 24, 26, located on one of the legs 20, 22, is spaced apart at a distance substantially equal to the width $w_T$ of the transistor 12. When the transistor 12 is frictionally engaged with the heat sink 10, transistor 12 is positioned between the tabs 24, 26.

Vents 28, 30 are disposed in a portion of one of the legs 20, 22. When the transistor 12 is frictionally engaged with the heat sink 10, the vents 28, 30 do not contact the transistor 12. A clasp 32 is disposed in a portion of one of the legs 20, 22 to engage the hole 16 in the metal tab 14 when the transistor 12 is frictionally engaged with the heat sink 10. Lip 34 is located at the bottom of one of the legs 20, 22 to aid in the insertion of the transistor 12.

When the heat sink 10 in frictionally engaged with the transistor 12, the transistor 12 is disposed between the first leg 20 and the second leg 22. The spring-like action of the legs 20, 22 clamp the transistor 12 between the legs 20, 22. The engagement of clasp 32 with hole 16 secures the transistor 12 onto the heat sink 10. The tabs 24, 26 engage the sides of the transistor 12 to maintain the orientation of the transistor 12 to the heat sink 10.

An alternate embodiment of a heat sink 36 in accordance with the present invention is shown in FIGS. 8–10. A locating stop 38 is disposed in a portion of one of the legs 20, 22 to abut the metal tab 14 when the transistor 12 is frictionally engaged with the heat sink 10. The stop 38 prevents the transistor 12 from extending above the stop 38 when the transistor 12 is being secured onto the heat sink 36.

A third embodiment of a heat sink 40 in accordance with the present invention is shown in FIGS. 11 and 12. Support members 42, 44 extend from a portion of one of the legs 20, 22 to provide additional support to the heat sink 40.

It will be understood that the invention may be embodied in other specific forms without departing from the spirit or central characteristics thereof. The present embodiment, therefore, is to be considered in all respects as illustrative and not restrictive, and the invention is not to be limited to the details given herein.

What is claimed is:

1. A clip-on heat sink for dissipating heat from a solid-state device attached thereto wherein said solid-state device has a width and a tab having an acceptance area, said heat sink comprising:

a generally U-shaped body having a first and a second continuous leg, said first continuous leg having a first and a second terminal edge defining a width; and said second continuous leg having a third and a fourth terminal edge defining a width substantially the same as said width of said first leg wherein said first and third terminal edge lay substantially in a first plane and said second and fourth terminal edge lay substantially in a second plane, said first leg having a first opposing free end, and said second leg having a second opposing free end, wherein said opposing free ends engage said solid state device, said clip-on heat sink having a singular unobstructed air passage extending between said legs and through said first and second planes.

2. The clip-on heat sink as claimed in claim 1, further comprising a clasp disposed in a portion of one of said legs, said solid-state device frictionally engaged with the heat sink, wherein said clasp engages the acceptance area.

3. The clip-on heat sink as claimed in claim 2, wherein said clasp is disposed in a portion of said second leg.

4. The clip-on heat sink as claimed in claim 1, further comprising a stop disposed in a portion of one of said legs, said solid-state device frictionally engaged with the heat sink, wherein said stop abuts the tab.

5. The clip-on heat sink as claimed in claim 4, wherein said stop is disposed in a portion of said second leg.

6. The clip-on heat sink as claimed in claim 1, wherein one of said legs has a lip.

7. The clip-on heat sink as claimed in claim 6, wherein said first leg has said lip.

8. A clip-on heat sink for dissipating heat from a solid-state device attached thereto wherein said solid-state device has a width and a tab having an acceptance region, said heat sink comprising:

a generally U-shaped body having a first and a second continuous leg, said first leg having a first and a second terminal edge defining a width greater than said width of said solid-state device;

said second continuous leg having a third and a fourth terminal edge defining a width substantially the same as said width of said first leg wherein said first and third terminal edge lay substantially in a first plane and said second and fourth terminal edge lay substantially in a second plane, said first leg having a first opposing free end, and said second leg having a second opposing free end, wherein said opposing free ends engage said solid state device, said clip-on heat sink having a singular unobstructed air passage extending between said legs and through said first and second planes; and a pair of inwardly-oriented tabs on one of said legs spaced apart at a distance substantially equal to said width of said solid-state device, said tabs for engaging sides of said solid-state device to maintain orientation of said solid-state device to said heat sink.

9. The clip-on heat sink as claimed in claim 8, wherein said pair of inwardly-oriented tabs is on said second leg.

10. The clip-on heat sink as claimed in claim 8, further comprising a first vent disposed in a portion of one of said legs, said solid-state device frictionally engaged with the heat sink, wherein said vent does not contact the solid-state device.

11. The clip-on heat sink as claimed in claim 8, further comprising a clasp disposed in a portion of one of said legs, said solid-state device frictionally engaged with the heat sink, wherein said clasp engages the acceptance area.

12. The clip-on heat sink as claimed in claim 8, further comprising a stop disposed in a portion of one of said legs, said solid-state device frictionally engaged with the heat sink, wherein said stop abuts the tab.

13. The clip-on heat sink as claimed in claim 8, wherein one of said legs has a lip.

14. A clip-on heat sink for dissipating heat from a solid-state device attached thereto wherein the solid-state device has a width and a tab having an acceptance region, said heat sink comprising:

a generally U-shaped body having a first and a second continuous leg, each leg having a central region with a width, each width defined by a pair of terminal edges, wherein said widths of said central region are substantially the same as said width of said solid-state device, wherein at least one of said continuous legs having at least one extension region extending coplanar with said central region, and said first leg having a first opposing free end, and said second leg having a second opposing free end, wherein said opposing free ends engage said solid state device, said clip-on heat sink having a singular unobstructed air passage extending through said first and second sides of said device between said legs.

15. The clip-on heat sink as claimed in claim 14, wherein said first vent is disposed in a portion of said second leg.

16. The clip-on heat sink as claimed in claim 14, further comprising a second vent disposed in a portion of one of said legs, said solid-state device frictionally engaged with said heat sink, wherein said vent does not contact said solid-state device.

17. The clip-on heat sink as claimed in claim 16, wherein said second vent is disposed in a portion of said second leg.

18. The clip-on heat sink as claimed in claim 14, further comprising a clasp disposed in a portion of one of said legs, said solid-state device frictionally engaged with the heat sink, wherein said clasp engages the acceptance area.

19. The clip-on heat sink as claimed in claim 14, further comprising a stop disposed in a portion of one of said legs, said solid-state device frictionally engaged with the heat sink, wherein said clasp abuts the tab.

20. The clip-on heat sink as claimed in claim 14, wherein one of said legs has a lip.

21. The clip-on heat sink as claimed in claim 14, further comprising a pair of inwardly-oriented tabs on one of said legs spaced apart at a distance substantially equal to the width of the solid-state device, said tabs for engaging sides of the solid-state device to maintain orientation of the solid-state device to said heat sink.

22. The clip-on heat sink as claimed in claim 14, further comprising a vent disposed in a portion of one of said legs, said solid-state device frictionally engaged with the heat sink, wherein said vent does not contact the solid-state device.

23. The clip-on heat sink as claimed in claims 1, 8 or 14, further comprising a support member extending from one of said continuous legs.

* * * * *